United States Patent [19]

Main

[11] 4,041,407
[45] Aug. 9, 1977

[54] DRIVER CIRCUIT FOR DEVELOPING QUIESCENT AND DYNAMIC OPERATING SIGNALS FOR COMPLEMENTARY TRANSISTORS

[75] Inventor: W. Eric Main, Mesa, Ariz.

[73] Assignee: Motorola, Inc., Chicago, Ill.

[21] Appl. No.: 624,690

[22] Filed: Oct. 22, 1975

[51] Int. Cl.² ............................................. H03F 3/183
[52] U.S. Cl. ...................................... 330/13; 330/22; 330/30 D
[58] Field of Search .................. 330/13, 15, 22, 30 D, 330/38 M, 40

[56] References Cited

U.S. PATENT DOCUMENTS

| | | | |
|---|---|---|---|
| 3,538,449 | 11/1970 | Solomon | 330/38 M |
| 3,611,170 | 10/1971 | Wheatley | 330/38 M X |

OTHER PUBLICATIONS

Fullagar, "Better Understanding of FET Operation Yields Viable Monolithic J.-FET OP. Amp" *Electronics*, Nov. 6, 1972, pp. 58–101.

*Primary Examiner*—James B. Mullins
*Attorney, Agent, or Firm*—Maurice J. Jones, Jr.

[57] ABSTRACT

The driver circuit includes a differential amplifier, a double-to-single ended converter, an emitter follower amplifier and an output stage having one portion for driving one external complementary transistor and another portion for driving another complementary transistor. The driver output transistors of each portion of the output stage each has a biasing network including a semiconductor junction and a resistor which are driven by a constant current source. The bias networks enable the driver output transistors to provide quiescent currents of known magnitudes for biasing the complementary output transistors and to have high current gains so that the current source is able to supply a constant current of minimal magnitude. The biasing networks further provide temperature compensation of the driver output transistors. The driver output stage is suitable for being driven by a single ended drive signal.

17 Claims, 2 Drawing Figures

DRIVER CIRCUIT FOR DEVELOPING QUIESCENT AND DYNAMIC OPERATING SIGNALS FOR COMPLEMENTARY TRANSISTORS

BACKGROUND OF THE INVENTION

Modern electronic equipments often require driver circuits for operating pairs of complementary output transistors. For instance, solid state, high power, audio frequency amplifiers usually include a pair of complementary discrete power transistors for driving a load such as a loud speaker. A driver circuit is generally coupled from a source of input signals to the complementary power transistors and a bias network associated with them. In some instances, it is desirable for the driver circuit to be manufactured in monolithic integrated circuit form to facilitate low cost, minimum space and maximum reliability. Such monolithic driver circuits are required to provide a quiescent current of a known magnitude for operating the bias network which can be located external to the integrated circuits and which biases the complementary pair for Class "AB" operation. Also, such monolithic circuits must provide drive signals of sufficient magnitude to operate the complementary transistors over a specified dynamic signal range.

Most discrete driver circuits for complementary output transistors are operated in the Class "A" mode. If such circuits are integrated and placed in standard packages, their power dissipation requirements would undesirably limit the amount of drive power available to the complementary output transistors. In particular, Class "A" drivers have poor efficiency because the magnitude of the quiescent current through the Class "A" circuit must approximate the magnitude of the current necessary to drive the complementary power transistors at the maximum output current. The large amount of current constantly required by Class "A" drivers under quiescent conditions would tend to undesirably cause heating of the integrated circuit chip and to undesirably load the power supply. In addition, most N-epi integrated circuits utilize PNP current sources which are not individually capable of supplying the amount of current demanded by Class "A" driver circuits. If such current sources were paralleled to meet the demand, they would take up an undesirable amount of valuable chip surface area.

Consequently, Class "B" power driver circuits have been developed for maximizing power to the complementary transistors during dynamic operation while minimizing the amount of power dissipated by the integrated circuit during quiescent operation. Some prior art Class "B" driver circuits tend to produce second harmonic or crossover distortion in the output signals because of unequal signal gains in each of the paths running from the signal supply to the control electrodes of each of the complementary output transistors. Furthermore, prior art Class "B" drive circuits tend to have temperature stability problems. Also, prior art Class "B" driver circuits sometimes themselves require a differential drive and thus are not suitable for being used directly with circuits providing only a single-ended drive signal. A further problem associated with some prior art complementary driver circuits relates to their inability to provide quiescent output currents of predetermined magnitudes for powering the bias networks associated with the complementary output transistors.

SUMMARY OF THE INVENTION

An object of the invention is provide an improved circuit configuration for driving complementary transistors.

Another object of the invention is to provide a driver circuit for complementary power transistors which is suitable for being manufactured in monolithic integrated circuit form.

Still another object of the invention is to provide a circuit configuration for driving complementary transistors which minimizes cross-over distortion and temperature stability problems.

A further object of the invention is to provide a circuit for driving complementary transistors which can be operated by a supply of single ended input signals.

A still further object of the invention is to provide a monolithic integrated driver circuit for operating complementary power transistors which provides a quiescent output current of a known magnitude for enabling biasing of the complementary pair.

An additional object of the invention is to provide an output stage for a monolithic integrated driver circuit which operates complementary push-pull power transistors over a wide dynamic range but which draws a quiescent current having a minimal magnitude.

The driver circuit of the invention is suitable for providing dynamic and quiescent output signals to first and second push-pull connected output transistors. The driver circuit includes a current supply for providing a substantially constant current which is shared between two driver transistors. The output electrodes of the two driver transistors are adapted to be respectively coupled to control electrodes of the first and second push-pull transistors. A bias circuit is coupled between control and first electrodes of one of the driver transistors and another bias circuit is coupled between the first and control electrodes of the other driver transistor. These bias circuits enable the two driver transistors to provide a known current for biasing the first and second push-pull output transistors during quiescent operation and high gain during dynamic operation.

DETAILED DESCRIPTION OF THE PREFERRED EMBODIMENTS

Figure 1:
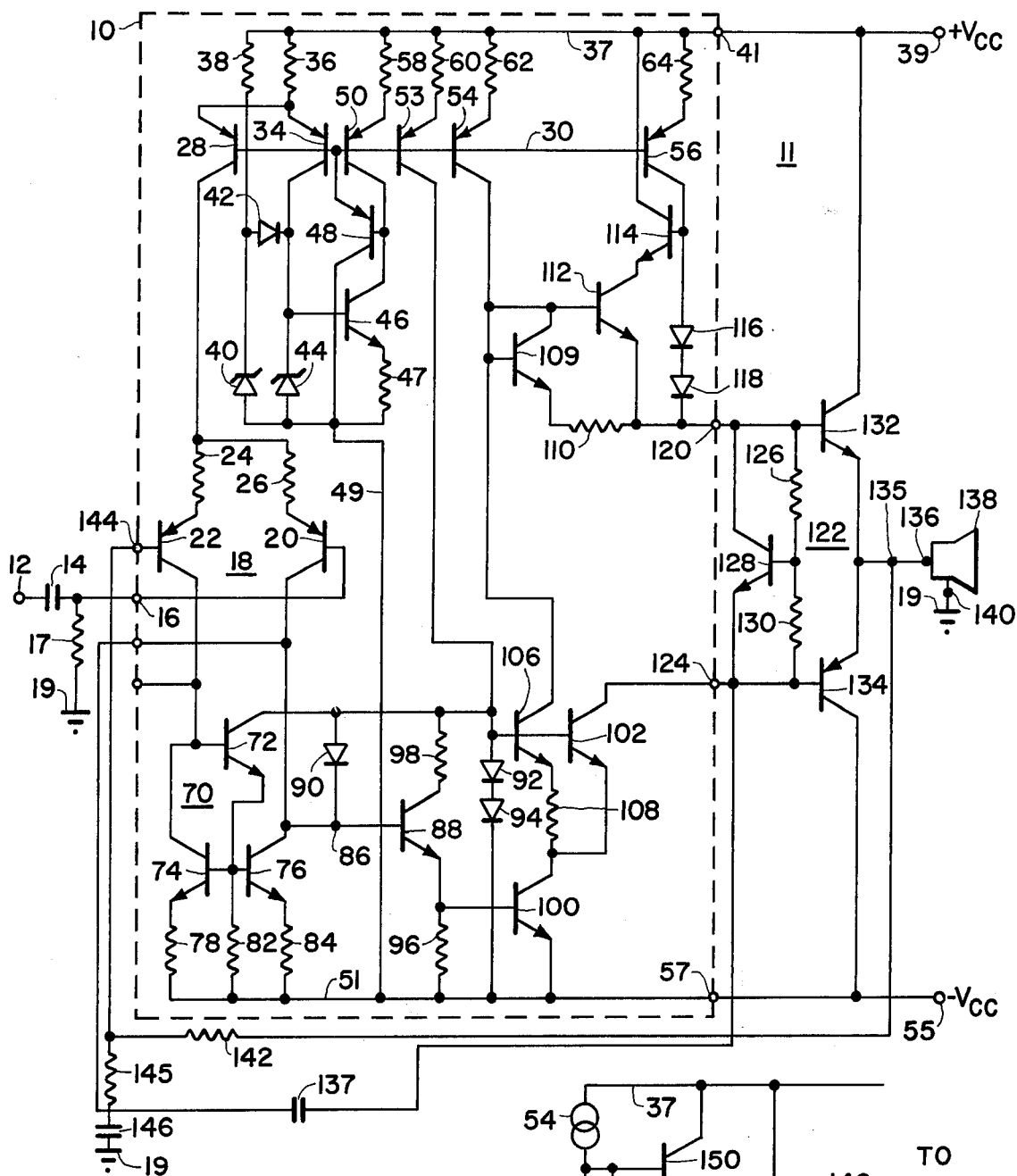
FIG. 1 is a schematic diagram of the monolithic driver circuit and associated external components.

FIG. 1 is a schematic diagram of driver circuit 10 of one embodiment of the invention which is suitable for being provided in monolithic integrated circuit form and the external components associated therewith, which together with circuit 10 form composite circuit 11. The composite circuit 11 is suitable for amplifying an audio frequency input signal applied at terminal 12 and which is coupled through external coupling capacitor 14 to pin out terminal 16. External resistor 17 which is connected between capacitor 14 and ground point 19 provides bias for differential amplifier 18 which includes differentially connected transistors 20 and 22. Resistors 24 and 26 connect the emitter electrodes of transistors 20 and 22 to the collector electrode of differential amplifier current source transistor 28.

The base electrode of current source transistor 28 is connected to conductor 30 which supplies control current to all of the current sources of driver amplifier 10. The emitter electrode of transistor 28 is connected to the emitter electrode of transistor 34. Resistor 36 couples the emitters of transistors 28 and 34 to positive power supply conductor 37. Positive power supply terminal 39 is connected through pin out 41 to conductor 37. Resistor 38 is connected between the cathode electrode of start up zener diode 40 and power supply conductor 37. Start up diode 42 couples the cathode electrode of zener diode 40 to the cathode electrode of zener diode 44 and to the base electrode of current source control transistor 46. The emitter electrode of transistor 46 is coupled through resistor 47 to the anodes of zener diodes 40 and 44. The collector electrode of transistor 48 is also connected to the anodes of zener diodes 40 and 44 which are coupled by conductor 49 to negative power supply conductor 51. Negative power supply terminal 55 is connected through pin out 57 to conductor 51.

The start up of current source transistor 28 will next be described. In response to the application of a power supply voltage between conductors 37 and 51, current flows through resistor 38 and begins energizing start up zener diode 40. As a result, a voltage of increasing magnitude is developed by zener diode 40 which forward biases diode 42 to provide base current for NPN transistor 46 and an energization current for zener 44. Consequently, transistor 46 is rendered somewhat conductive and draws current from the base electrode of PNP transistor 48 which conducts the base currents for all of the current supply or source transistors connected to conductor 30. Consequently, transistor 34 then supplies even more base current to transistor 46. Thus, transistor 46 continues to conduct an increasing amount of current until the base-to-emitter voltage thereof plus the voltage across resistor 47 equals the breakover voltage of zener diode 44. The magnitude of the currents provided by each of the current sources connected to conductor 30 continues to increase until the current in the collector of current source transistor 50 equals the magnitude of the collector current of transistor 46 minus the relatively small amount of base current drawn by transistor 48. When this condition is met, since zener diode 44 has a breakover voltage of a greater magnitude than the breakover voltage of zener diode 40, diode 42 becomes reverse biased to isolate start up resistor 38 and start up zener diode 40 from the remainder of driver circuit 10.

After start up, zener diode 44 biases transistor 46 at a substantially fixed voltage so that constant currents are provided by the collector electrode of each of current source transistors 28, 34, 50, 53, 54, and 56 which all have their base electrodes connected to conductor 30. Resistors 58, 60, 62 and 64, respectively couple the emitters of current source transistors 50, 53, 54 and 56 to positive supply conductor 37.

Differential-to-single ended converter circuit 70 is connected between the collector electrodes of differentially connected transistors 20 and 22 which provide the differential output terminals of amplifier 18. Specifically, the base electrode of transistor 72 is connected to the collector electrode of transistor 74 and to the collector electrode of transistor 22. The collector electrode of transistor 76 is connected to the collector electrode of transistor 20. The emitter electrode of transistor 72 is connected to the base electrodes of transistors 74 and 76. Resistors 78, 82 and 84 respectively connect the emitter electrode of transistor 74, the base electrode of transistor 76 and the emitter electrode of transistor 76 to negative supply conductor 51.

Differential-to-single ended converter circuit 70 tends to cause the quiescent currents from transistors 76 and 22 to be approximately equal in magnitude. In particular, transistor 72 cooperates with transistor 74 to cause the collector current of transistor 74 to be equal to the collector current of transistor 22. As the output current of transistor 22 increases, transistor 72 provides more current to resistor 82 which results in increased drive for transistor 74. As the magnitude of the collector current of transistor 74 becomes equal to the magnitude of the collector current of transistor 22, transistor 72 tends to be rendered nonconductive. Hence, the current conducted by transistor 74 under quiescent conditions is equal to the collector current of transistor 22 with the small base current of transistors 72 subtracted therefrom. Since transistor 76 is matched to transistor 74 and resistors 78 and 84 have the same resistances, the voltage across resistor 82 causes the magnitude of the quiescent collector current of transistor 76 to be approximately equal to the collector current conducted by transistor 74 during quiescent conditions. Consequently, the magnitude of the quiescent current of differential-to-single ended converter 70 at output terminal 86 thereof is substantially constant.

The base electrode of emitter follower transistor 88 and the cathode of clamp diode 90 are connected to output terminal 86. Biasing diodes 92 and 94 are connected in series between the anode of diode 90 and negative supply point 51. Resistor 96 is connected between the emitter electrode of transistor 88 and negative power supply conductor 51. Driver transistor 100 includes a base electrode which is connected to the emitter electrode of transistor 88 and a collector electrode which is connected to the emitter electrode of transistor 102. The base electrode of driver output transistor 102 is connected to the anode of diode 92 and to the base electrode of transistor 106. The collector electrode of transistor 106 is connected to the collector electrode of current source transistor 54 and the emitter electrode of transistor 106 is coupled through resistor 108 to the collector electrode of transistor 100.

Emitter follower transistor 88 is biased by the voltage at output terminal 86 of the differential-to-single ended converter 70. Diodes 92 and 94 develop bias voltages for transistors 102 and 106 in response to the constant current from the collector electrode of current source transistor 53. Transistors 100, 102, 106, resistor 108, diodes 92 and 94 form the "pull-down" portion of the output stage of class "AB" power driver 10.

The "pull-up" portion of the output stage of "AB" power driver 10 includes diode connected transistor 109 which has base and collector electrodes connected to the collector of current source transistor 54. Resistor 110 is connected between the emitter electrode of transistor 109 and the emitter electrode of transistor 112. Transistor 114 includes an emitter electrode connected to the collector electrode of transistor 112, a collector electrode connected to positive power supply conductor 37, and a base electrode connected to the anode of diode 116. Diode 118 is coupled between the cathode electrode of diode 116 and pin out 120 of driver amplifier 10.

Under quiescent conditions, diode connected transistor 109 and resistor 110 provide bias signals to the base electrode of transistor 112 so that it is rendered slightly conductive. Diodes 116 and 118 develop bias voltage for transistor 114. The base-to-emitter junction of transistor 106 and resistor 108 bias transistor 102.

Biasing network 122, which is connected between pin outs 120 and 124, provides bias to discrete complementary transistors 132 and 134 in known manner. Network 122 includes resistor 126, transistor 128 and resistor 130. The base electrode of transistor 128 is connected to the junction between resistors 126 and 130. The collector electrode of transistor 128 and one terminal of resistor 126 is connected to the base electrode of NPN discrete output power transistor 132. The emitter electrode of transistor 128 and a terminal of resistor 130 are connected to the base electrode of PNP discrete output power transistor 134, compensation capacitor 137 and pin out 124. The emitter electrodes of complementary transistors 132 and 134 are connected to feedback terminal 135 and to drive terminal 136 of loudspeaker 138. Terminal 140 of loudspeaker 138 is connected to ground or reference point 19. Feedback terminal 135 is coupled through resistor 142 and pinout terminal 144 to the base electrode of transistor 22 of differential amplifier 18. Resistor 145 and feedback capacitor 146 couple the base electrode of transistor 22 to ground point 19.

The feedback loop assures that terminal 135 remains at a quiescent voltage approximately equal to the reference potential at point 19, which is usually midway between the positive and the negative power supply voltages. More specifically, if the magnitude of the output voltage at terminal 135 tends to become undesirably high then voltage and current are provided through the feedback network to render transistor 22 less conductive. Consequently, the conduction of transistor 20 increases thereby causing common emitter amplifier transistors 88 and 100 to likewise be rendered more conductive. Transistor 100 then causes transistor 106 to be rendered more conductive so that some of the current provided by current source 54 is shunted away from transistor 112. Consequently, the drive to transistor 132 is reduced which tends to lower the undesirably high magnitude of the quiescent output voltage at terminal 135. In addition, the increased conductivity of transistors 100 and 106 causes transistor 102 to be rendered more conductive. Thus, output complementary transistor 134 is rendered more conductive which also tends to lower the undesirably high magnitude of the quiescent output voltage at terminal 135.

If the quiescent output voltage magnitude at terminal 135 tends to become too low, then transistor 22 is rendered more conductive and transistor 20 is rendered less conductive. Consequently, transistors 88, 100, 102 and 106 are rendered less conductive so that more of the drive current provided by current source transistor 54 is supplied to transistor 112. Consequently, the drive to transistor 132 is increased and the magnitude of the quiescent output voltage at terminal 135 is increased. Moreover, since transistor 102 is rendered less conductive, transistor 134 is less conductive. Consequently, transistor 134 also tends to "push" the undesirably low magnitude of the quiescent output voltage at terminal 135 up to the stabilized value.

Thus, the feedback network stabilizes the quiescent voltages at terminal 135 and throughout composite amplifier 11.

The dynamic operation of composite amplifier circuit 11 will next be considered. It is assumed that an input signal having a sinusoidal wave form is applied to terminal 12. As the magnitude of the voltage on terminal 12 swings in the positive direction toward its positive peak, transistor 20 will be rendered less conductive causing transistor 22 to be rendered more conductive. Consequently, transistors 72, 74 and 76 are rendered more conductive. Since transistor 20 is providing less collector current and transistor 76 is more conductive, the drive to the common emitter amplifier transistors 88 and 100 is reduced to render them less conductive. Consequently, the base-to-emitter drive of transistors 102 and 106 is decreased so that more of the constant current provided by transistor 54 is applied to diode connected transistor 109 and resistor 110. Consequently, transistor 112 increases the drive to transistor 132 which tends to cause the dynamic amplitude of the output voltage at terminal 136 to change in a manner similar to the change in the magnitude of the positive excursion of the input signal applied to terminal 12.

In addition, transistor 102 is rendered less conductive by transistor 100 to decrease the drive to transistor 134 which thereby operates in an additive manner to also cause the output voltage at terminal 135 to increase during the positive going excursion of the magnitude of the input voltage at input terminal 12.

Diode 90 operates to insure that transistor 76 is not driven into saturation during the peaks of the positive excursions of the input signal. More specifically, the anode voltage of diode 90 is held at two diode drops above ground by diodes 92 and 94. Consequently, the collector-to-base junction of transistor 76 is held to at least one diode drop above ground so that transistor 76 cannot go into saturation and distort the single ended output signal at terminal 86.

As the magnitude of the input signal applied to terminal 12 swings toward its negative peak, transistor 20 tends to be rendered increasingly more conductive and transistor 22 is rendered increasingly less conductive. Consequently, transistors 88, 100, 102 and 106 are rendered more conductive. Transistor 106 then shunts more of the drive current provided by current source transistor 54 away from transistors 109 and 112 and hence from transistor 132, which enables the voltage at terminal 135 to drop in the negative direction. Furthermore, transistors 100 and 102 provide a path for the base current of transistor 134 to increase the negative excursion of the output voltage at terminal 136. Thus, the output stage of amplifier circuit 10 is suitable for being driven by single ended output signals at terminal 86.

As the magnitude of the output voltage at terminal 136 drops in a negative direction, transistor 112 is subjected to an increasingly higher collector-to-emitter breakdown voltage magnitude. Transistor 114 tends to absorb part of the voltage which would otherwise be developed across transistor 112 so that transistor 112 is thereby protected from the possible adverse effects of collector-to-emitter voltages having high magnitudes.

The biasing networks for the portions of the output stage of circuit 10 include diode connected transistor 109 and resistor 110, which are connected in series between the base-to-emitter electrodes of transistor 112, and the base-to-emitter junction of transistor 106 and resistor 108, which are connected in series between the base-to-emitter electrodes of transistor 102. These biasing networks enable the magnitude of the constant current from current source transistor 54 to have a low magnitude but still drive output transistors 132 and 134 over a wide dynamic range. Also, these biasing networks enable transistors 112 and 102 to have high current gains.

More specifically, as the current increases through diode connected transistor 109 and resistor 110, the base-to-emitter drive voltage for transistor 112 increases so that its collector current increases much more than the magnitude of the bias current increases. The increase in drive results mostly from the increase in the magnitude of the voltage developed across resistor 110. Under quiescent conditions, about half of the current provided by transistor 54 is supplied to the collector of transistor 106 and the other half is applied to the base electrodes of transistors 109 and 112. Assume that under maximum positive drive all of the current supplied by constant current source transistor 54 is provided to the base electrodes of transistors 109 and 112. Under maximum positive drive conditions the junction voltage of diode connected transistor 109 might increase on the order of 18 millivolts but the voltage across resistor 26 might increase on the order of 60 millivolts. Since the current through transistor 112 doubles for every 18 millivolt increase in base-to-emitter voltage, the current through transistor 112 increases at least 16 times even though the drive current only doubled. Thus, resistor 110 enables the "pull-up" portion of the driver output circuit to have a high current gain.

A similar argument applies for transistor 102 during the negative excursions of the input voltage. In particular, transistor 100 becomes increasingly more conductive as the magnitude of the input signal applied at terminal 12 increases in the negative direction. Consequently, transistors 102 and 106 become more conductive in response to the resulting increase in the base-to-emitter voltages thereof. Hence, more of the constant current provided at the collector of transistor 54 is shunted away from the base electrodes of transistors 109 and 112 through transistor 106, resistor 108 and transistor 100. While the base-to-emitter voltage of transistor 106 increases slightly, the magnitude of the voltage across resistor 108 increases to a much greater extent in response to the increase in current through the bias network for transistor 102. Thus, the increased voltage across resistor 108 causes transistor 102 to have a much higher current gain than if resistor 108 was not connected in the bias circuit for transistor 102. The resistances of resistors 108 and 110 are chosen to enable respective transistors 102 and 112 to have high current gains during dynamic operation and low but predictable current gains during quiescent operation.

In one embodiment of the invention, current source transistor 54 provides about 500 microamps. This current enables transistors 112 and 102 to provide a quiescent output current through network 122 of about 1.86 milliamps and a "pullup" and "pulldown" current of about 9 milliamps through respective pinouts 120 and 124. For this embodiment resistor 110 has a resistance of about 270 ohms and resistor 108 has a resistance of about 180 ohms. A corresponding prior art class "A" power driver circuit would probably require current source transistor 54 to supply approximately 9 milliamps to enable the generation of the foregoing "pull up" and "pull down" currents.

Diode connected transistor 109 and the base-to-emitter junction voltage of transistor 106 enable circuit 10 to provide quiescent output currents of known magnitudes for enabling precise biasing of complementary transistors 132 and 134. More specifically, if resistors 108 and 110 had 0 resistances, the magnitudes of the emitter currents of transistors 102 and 112 would be equal to the respective magnitudes of the emitter currents of transistors 106 and 109, assuming that all of the emitter areas are equal. Under quiescent conditions the current provided by current supply transistor 54 divides about equally between the path including transistor 106 and the other path including transistors 109 and 112. Thus, under quiescent conditions relatively small amounts of current are conducted by resistors 108 and 110. Since these resistors have small resistances, the magnitude of the current provided to biasing network 122 is predictable because it is controlled by the ratios of the emitter areas. In addition to enabling the magnitude of the quiescent output currents of circuit 10 to be predictable, transistors 106 and 109 tend to counterbalance temperature induced changes in respective transistors 102 and 112 for temperature stabilizing the driving bias current of network 122. Furthermore, crossover or second harmonic distortion is minimized by the resulting Class A push-pull operation of transistors 112 and 102. Neither transistor 112 nor 102 switches off during normal operations.

Figure 2:
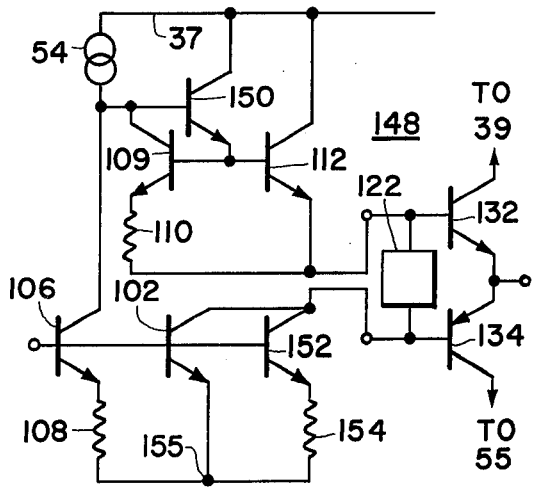
FIG. 2 is a schematic diagram of an alternative embodiment of the output stage of the monolithic driver circuit of FIG. 1.

FIG. 2 is a partial schematic diagram showing an alternative embodiment 148 of the output stage of driver circuit 10. Identical reference numbers are used in FIG. 1 and FIG. 2 for corresponding components. An added transistor 150 includes a base electrode connected to the collector electrode of transistor 109, an emitter electrode connected to the base electrode of transistor 112, and a collector electrode connected to positive supply conductor 37. Another added transistor 152 of FIG. 2 includes a base electrode connected to the base electrode of transistor 106 and to the base electrode of transistor 102, and a collector electrode connected to the collector electrode of transistor 102. Resistor 154 is connected between the emitter electrode of transistor 152 and terminal 155 which may be directly connected to conductor 51. Resistors 108, 154 and the emitter of transistor 102 are interconnected at terminal 155 and the drive voltage can be applied between the base of transistor 106 and terminal 155.

The circuitry 148 of FIG. 2 facilitates ease of design as compared to circuit 10 because of the buffering and symmetry provided by added transistors 150 and 152 and resistor 154. These components enable the quiescent current conducted by transistor 102 to be more nearly equal to the corresponding quiescent current conducted by transistor 112. Furthermore, the quiescent current conducted by transistor 152 is essentially equal to the quiescent current conducted by transistor 109. In the circuit of FIG. 1, the quiescent collector current of transistor 102 must be equal to the emitter currents of transistors 109 and 112, which tends to slightly unbalance the circuit and complicate analysis. Alternatively, in the circuit of FIG. 2 the quiescent emitter currents of transistors 109 and 112 after passing through bias network 122 are conducted by transistors 152 and 102. Transistor 150 of FIG. 2 divides the base currents required by transistors 109 and 112 approximately by beta to maintain symmetry. Consequently, the current from the collector of current source transistor 54 divides more nearly equally between the collectors of transistors 106 and 109 of FIG. 2 under quiescent condition than it does for the circuit of FIG. 1. Although the circuit of FIG. 2 facilitates analysis and precise control of the bias currents, the circuit of FIG. 1 is adequate for most applications.

Circuits 10 and 148 for driving complementary transistors 132 and 134 have been described. The circuitry shown in block 10 of FIG. 1 and circuit 148 of FIG. 2 are suitable for being manufactured in monolithic integrated circuit form. Utilization of diode connected transistor 109 and the base-to-emitter junction of transistor 106 minimize temperature stability problems and facilitate the generation of a quiescent output current of known, predetermined magnitude for enabling precise biasing of transistors 132 and 134. The combination of transistors 109 and resistor 110 for biasing transistor 112 Class "A" and the combination of the base-to-emitter junction of transistor 106 and resistor 108 for biasing transistor 102 Class "A" eliminates crossover distortion. The output stage of the driver circuit, which includes transistors 100, 102, 106, resistor 108, transistor 109, resistor 110 and transistor 112, is operated by single ended output signals occurring at the emitter electrode of transistor 88. Negative feedback is utilized between terminals 135 and 144 to stabilize the quiescent voltages of circuit 10 and the external components connected thereto. Monolithic integrated driver circuit 10 operates complementary push-pull power transistors 132 and 134 over a wide dynamic range and requires a minimal quiescent current.

I claim:

1. A push-pull driver circuit for providing dynamic and quiescent output signals to first and second push-pull connected output electron control devices which have a bias circuit for preventing crossover distortion coupled thereto, the push-pull driver circuit including in combination:
    first current supply means for providing a substantially constant current at an output terminal thereof;
    first driver transistor means for amplifying a dynamic driving signal and having first, second, and control electrodes, said control electrode being coupled to said output terminal of said first current supply means, said first electrode being adapted to be coupled to both the control electrode of the first push-pull connected electron control device, and to the bias circuit;
    first bias means for enabling said first driver transistor means to have a high gain and for controlling the magnitude of the quiescent current provided by said first driver transistor means to the first push-pull connected electron control device, said first bias means being coupled between said control and first electrodes of said first driver transistor means;
    second driver transistor means for amplifying a dynamic driving signal and having first, second and control electrodes, said second electrode of said second driver transistor means being adapted to be coupled to both the control electrode of the second push-pull connected electron control device and to the bias circuit; and
    second bias means coupled to said second driver transistor means for enabling said second driver transistor means to have a high gain and for controlling the magnitude of the quiescent current provided by said second driver transistor means to the second push-pull connected electron control device; and
    driver circuit means for dynamically driving said first and second driver transistor means, said driver circuit means being coupled between said output terminal of said first current supply means and said control electrodes of said first driver transistor means and said second driver transistor means.

2. The push-pull driver circuit of claim 1 wherein said first bias means includes:
    diode means for controlling the quiescent current of said first driver transistor means, said diode means having a first electrode and a second electrode, said second electrode being connected to said output terminal of said first current supply means and to said control electrode of said first driver transistor means; and
    resistive means for enabling said first driver transistor means to have a high current gain, said resistive means being coupled between said first electrode of said diode means and said first electrode of said first driver transistor means.

3. The push-pull driver circuit of claim 1 wherein said second bias means includes:
    further transistor means for controlling the quiescent current provided by said second driver transistor means, said further transistor means having a control electrode connected to said second driver transistor means, a first electrode, and a second electrode coupled to said output terminal of said first current supply means and to said first bias means; and
    resistive means for enabling said second driver transistor means to have a high current gain, said resistive means being coupled between said first electrode of said further transistor means and said second driver transistor means.

4. The push-pull driver circuit of claim 3 further including in combination:
    further current supply means for providing a substantially constant current at an output terminal thereof; and
    further diode means for biasing said further transistor means, said further diode means having an electrode connected to said further current supply means and to said control electrode of said further transistor means.

5. The push-pull driver circuit of claim 4 further including in combination:
    signal supply means adapted to provide dynamic driving signals having first and second relative polarities at an output terminal thereof; and
    further driver transistor means for dynamically operating said first driver transistor means and said second driver transistor means, said further driver transistor means having a first electrode, a control electrode coupled to said output terminal of said signal supply means for receiving said drive signals, and a second electrode coupled to said second driver transistor means and said further transistor means, said driver transistor means being responsive to said signals of one of said first and second relative polarities to render said second driver transistor means more conductive which enables the second push-pull connected electron control device to be more conductive, and to render said further transistor means conductive so that current from said first current supply means is shunted away from said control electrode of said first driver transistor means to thereby cause the first push-pull connected electron control device to be less conductive.

6. The push-pull driver circuit of claim 1 further including feedback means for stabilizing the magnitude of the quiescent signals provided by said first and second driver transistor means respectively to the first and second push-pull connected electron control devices, said feedback means being coupled between the first and second push-pull connected electron control devices and said first and second bias means.

7. The push-pull driver circuit of claim 1 further including in combination:
further transistor means coupling said control electrode of said first driver transistor means to said output terminal of said first current supply means; and
additional transistor means having a control electrode coupled to said control electrode of said second driver transistor means, and a further electrode coupled to said second electrode of said second driver transistor means.

8. The push-pull driver circuit of claim 1 further including:
power conducting means;
circuit means coupling said second electrode of said first driver transistor means to said power conducting means so that said first driver transistor means can conduct a dynamic drive current to the first push-pull connected electron control device having a greater magnitude than said substantially constant current of said first current supply means.

9. A monolithic integrated driver circuit for providing dynamic and quiescent output signals to first and second push-pull complementary devices located externally to the monolithic driver circuit, including in combination:
differential amplifier means for amplifying a dynamic input signal having first and second relative polarities applied to an input terminal thereof, said differential amplifier means providing a differential signal between differential output terminals thereof in response to said dynamic input signal;
differential-to-single ended converter means for converting said differential signal into a single ended signal, said differential-to-single ended converter means having an input terminal connected to an output terminal of said differential amplifier means and an output terminal at which said single ended signal is developed;
first current supply means for providing a substantially constant current of a predetermined magnitude at an output terminal thereof;
power conducting means;
first driver circuit output portion having an output terminal coupled to said first push-pull connected external complementary device for controlling the quiescent and for amplifying the dynamic drive currents to have an amplitude greater than said predetermined magnitude to drive the first push-pull connected external complementary device, said first driver circuit output portion having a control terminal coupled to said output terminal of said first current supply means and a power input terminal coupled to said power conducting means;
second driver circuit output portion having an output terminal coupled to said second push-pull connected external complementary device for controlling the quiescent and for amplifying the dynamic driver currents of the second push-pull connected external complementary device, said second driver circuit output portion having a first terminal coupled to both said output terminal of said first current supply means and to said control terminal of said first driver circuit output portion, said second driver circuit output portion further having a second terminal; and driver means for controlling said first and second driver circuit output portions, said driver means being coupled between said output terminal of said differential-to-single ended converter means and said second terminal of said second driver circuit output portion.

10. The monolithic driver circuit of claim 8 wherein said first driver circuit output portion includes:
first transistor means having a control electrode coupled to said output terminal of said first current supply means, a first electrode adapted to be coupled to the first push-pull complementary device; and
first bias means for enabling said first transistor means to have a high gain and for controlling the magnitude of the quiescent current provided by said first transistor means to the first push-pull complementary device, said first bias means being coupled between said control electrode and said first electrode of said first transistor means.

11. The monolithic driver circuit of claim 9 wherein said first driver circuit output portion further includes in combination:
second transistor means having a control electrode coupled to said first bias means, a first electrode connected to said control electrode of said first transistor means, and a second electrode coupled to said power conducting means.

12. The monolithic driver circuit of claim 9 wherein said first bias means includes:
diode means for controlling the quiescent current of said first transistor means, said diode means having a first electrode, and a second electrode connected to said output terminal of said first current supply means; and
resistive means for enabling said first transistor means to have a high current gain, said resistive means being coupled between said first electrode of said diode means and said first electrode of said first transistor means.

13. The monolithic driver circuit of claim 9 wherein said second driver output portion includes in combination:
second transistor means having a first control electrode coupled through said second terminal to said driver means, a second electrode adapted to be coupled to the second push-pull transistor, and a second control electrode; and
second bias means for enabling said second transistor means to have a high gain and for controlling the quiescent current provided by said second transistor means to the second push-pull complementary device, said second bias means being coupled between said output terminal of said first current supply means and said control electrode of said first transistor means and said second control electrode of said second transistor means.

14. The monolithic driver circuit of claim 12 wherein said second bias means includes:
further transistor means for controlling the quiescent current provided by said second transistor means, said further transistor means having a control electrode, a first electrode, a second electrode coupled to said output terminal of said first current supply means and to said first bias means; and
resistive means for enabling said second transistor means to have a high current gain, said resistive means being coupled between said first electrode of said further transistor means and said second control electrode of said second transistor means.

15. The monolithic driver circuit of claim 14 further including in combination:

further current supply means providing a substantially constant current at an output terminal thereof; and further diode means for biasing said further transistor means, said further diode means having an electrode connected to said further current supply means and to said control electrode of said further transistor means.

16. The monolithic driver circuit of claim 8 wherein said driver means includes an emitter follower amplifier circuit.

17. The monolithic driver circuit of claim 8 further including feedback means coupled between the push-pull complementary devices and one input terminal of said differential amplifier means for stabilizing the quiescent currents developed by said first and second driver circuit output portions.